(12) United States Patent
Shi et al.

(10) Patent No.: US 12,733,201 B2
(45) Date of Patent: Sep. 8, 2026

(54) METAL-OXIDE SEMICONDUCTOR FIELD-EFFECT TRANSISTOR HAVING ENHANCED HIGH-FREQUENCY PERFORMANCE AND METHODS FOR FABRICATING SAME

(71) Applicant: SHANGHAI BRIGHT POWER SEMICONDUCTOR CO., LTD., Shanghai (CN)

(72) Inventors: Lei Shi, Shanghai (CN); Jian Wu, Shanghai (CN); Hang Fan, Shanghai (CN); Luyao Song, Shanghai (CN); Shuming Xu, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 761 days.

(21) Appl. No.: 17/889,834

(22) Filed: Aug. 17, 2022

(65) Prior Publication Data

US 2023/0335636 A1 Oct. 19, 2023

(30) Foreign Application Priority Data

Apr. 18, 2022 (CN) ......................... 202210403499.5

(51) Int. Cl.
*H10D 30/65* (2025.01)
*H10D 62/17* (2025.01)
(Continued)

(52) U.S. Cl.
CPC ........... *H10D 30/65* (2025.01); *H10D 62/393* (2025.01); *H10D 64/516* (2025.01); *H10P 30/204* (2026.01); *H10P 30/21* (2026.01)

(58) Field of Classification Search
CPC ........... H10D 30/0221; H10D 30/0281; H10D 30/603; H10D 62/116; H10D 64/01; H10D 64/112; H10D 64/512
See application file for complete search history.

(56) References Cited

U.S. PATENT DOCUMENTS

2010/0301403 A1* 12/2010 Min ..................... H10D 64/112 438/266
2014/0320174 A1* 10/2014 Lu .......................... H10D 30/65 327/109
(Continued)

FOREIGN PATENT DOCUMENTS

CN 111463263 A * 7/2020 ......... H01L 29/0684

*Primary Examiner* — Fazli Erdem
(74) *Attorney, Agent, or Firm* — Myers Bigel, P.A.

(57) ABSTRACT

A high-frequency LDMOS device includes a semiconductor substrate of a first conductivity type, a doped drift region of a second conductivity type formed on the substrate, and a body region of the first conductivity type formed in the doped drift region. Source and drain regions of the second conductivity type are formed proximate an upper surface of the body region and doped drift region, respectively, and spaced laterally from one another. A first insulating layer is formed on the body and doped drift regions. A gate structure including multiple gate segments is formed on the first insulating layer. Each of the gate segments is spaced laterally from one another by a second insulating layer disposed between adjacent gate segments. A spacing between adjacent gate segments is controlled as a function of a thickness of the second insulating layer, a thickness of the first and second insulating layers being independently controlled.

21 Claims, 10 Drawing Sheets

(51) Int. Cl.

| | |
|---|---|
| ***H10D 64/27*** | (2025.01) |
| ***H10P 30/20*** | (2026.01) |

(56) References Cited

U.S. PATENT DOCUMENTS

| | | | | |
|---|---|---|---|---|
| 2017/0110536 | A1* | 4/2017 | Hsiao | H01L 23/535 |
| 2021/0159333 | A1* | 5/2021 | Lee | H10D 30/65 |
| 2021/0234042 | A1* | 7/2021 | Xu | H10D 30/655 |
| 2021/0376096 | A1* | 12/2021 | Vellianitis | H10D 30/6729 |
| 2022/0262907 | A1* | 8/2022 | Lin | H10D 62/116 |

* cited by examiner 800D
816
810
808
812
814
818
806
P-BODY
NDD
804
802
P-SUB

METAL-OXIDE SEMICONDUCTOR FIELD-EFFECT TRANSISTOR HAVING ENHANCED HIGH-FREQUENCY PERFORMANCE AND METHODS FOR FABRICATING SAME

CROSS-REFERENCE TO RELATED APPLICATIONS

The present application is a counterpart of, and claims priority to, Chinese Patent Application No. 2022104034995, filed on Apr. 18, 2022, the disclosure of which is incorporated by reference herein in its entirety for all purposes.

BACKGROUND

The present invention relates generally to the electrical, electronic and computer arts, and, more particularly, to metal-oxide semiconductor field-effect transistor devices and fabrication methods.

Modern wireless communication circuits and other high-speed systems have placed extremely demanding requirements on both power and linearity performance of, for example, power amplifiers and switching circuitry operating at microwave frequencies. These increasingly stringent power and linearity requirements have made the design of high-frequency, high-power circuit components challenging. Silicon laterally-diffused metal-oxide semiconductor (LDMOS) power transistors have dominated such applications over the past years. However, with the approaching limits of operability for such devices, there will be a need for other semiconductor materials and/or device structures to meet the high-power and high-linearity requirements of next generation wireless technologies.

It is well known to employ a field plate structure in an LDMOS device. A field plate is essentially an extension of the gate over a drift region in the LDMOS device. The field plate, which is typically formed of polysilicon, has been shown to not only increase breakdown voltage in the LDMOS device but also to suppress a surface state, which markedly affects the power performance of the device. The large gate polysilicon area also helps to accumulate electrons in the drift region under the field plate during an on-state of the LDMOS device, thereby reducing on-resistance ($R_{Dson}$) in the device.

Unfortunately, although the field plate structure in a conventional MOSFET device helps to improve some device performance metrics (e.g., increasing the breakdown voltage of the device by modulating the electric field locally), the added overlap between the gate and drift region of the device introduces undesirable parasitic feedback capacitance, also referred to as Miller capacitance, from drain to gate ($C_{gd}$). More particularly, from a circuit standpoint, the field plate behaves as a gate-to-drain feedback capacitor which provides additional modulation of signals at the input and output of the device. Such parasitic feedback capacitance undesirably impacts the overall high-frequency performance of the device, particularly in high-speed switching applications, due at least in part to additional phase variations provided through the feedback path, and also results in a large power loss in the device. Consequently, high-frequency applications demand an LDMOS device with as small a gate-to-drain capacitance $C_{gd}$ as possible.

SUMMARY

The present invention, as manifested in one or more embodiments, beneficially provides an enhanced gate structure for use in a high-frequency LDMOS device, and methods for fabricating such a device. This gate structure is advantageously compatible with existing complementary metal-oxide semiconductor (CMOS) fabrication technology and does not rely on the use of costly and complex processes or esoteric materials, such as, for instance, a dual silicide gate structure, to achieve a substantial improvement in device high-frequency performance. Moreover, embodiments of the present invention advantageously achieve enhanced high-frequency performance, for example by reducing gate charge ($Q_g$) and/or reducing gate-to-drain capacitance ($C_{gd}$), without significantly degrading breakdown voltage and/or on-resistance ($R_{Dson}$) in the device.

In accordance with an embodiment of the invention, an LDMOS device having enhanced high-frequency performance includes a semiconductor substrate of a first conductivity type, a doped drift region of a second conductivity type formed on the substrate, and a body region of the first conductivity type formed in the doped drift region proximate an upper surface of the doped drift region. The second conductivity type is opposite in polarity to the first conductivity type. Source and drain regions of the second conductivity type are formed proximate an upper surface of the body region and doped drift region, respectively, and spaced apart laterally from one another. A first insulating layer is formed on at least a portion of an upper surface of the body region and an upper surface of the doped drift region. The LDMOS further includes a gate structure including multiple gate segments formed on an upper surface of the first insulating layer. Each of the gate segments is spaced laterally from one another by a second insulating layer disposed between adjacent gate segments. A spacing between adjacent gate segments is controlled as a function of a thickness of the second insulating layer, a thickness of the first and second insulating layers being independently controlled.

In accordance with an embodiment of the invention, a method of fabricating an LDMOS device having enhanced high-frequency performance includes: forming a semiconductor substrate of a first conductivity type; forming a doped drift region of a second conductivity type on at least a portion of the substrate, the second conductivity type being opposite in polarity to the first conductivity type; forming a body region of the first conductivity type in the doped drift region proximate an upper surface of the doped drift region; forming source and drain regions of the second conductivity type proximate an upper surface of the body region and doped drift region, respectively, and spaced apart laterally from one another; forming a first insulating layer on at least a portion of an upper surface of the body region and an upper surface of the doped drift region; forming a gate structure comprising a plurality of gate segments on an upper surface of the first insulating layer, each of the gate segments being spaced laterally from one another by a second insulating layer disposed between adjacent gate segments; and controlling a spacing between adjacent gate segments as a function of a thickness of the second insulating layer, a thickness of the first and second insulating layers being independently controlled.

Techniques of the present invention can provide substantial beneficial technical effects. By way of example only and without limitation, an LDMOS device according to one or more embodiments of the invention may provide at least one or more of the following advantages:

- lower on-state resistance $R_{DS\text{-}on}$;
- reduced parasitic capacitance, including gate-to-drain capacitance, $C_{gd}$;
- reduced switching loss;

higher frequency application;

compatible with standard CMOS fabrication process technology and materials;

improved shoot-through immunity due to reduced gate noise resulting from lower $C_{gd}$.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 8A-8F are cross-sectional views depicting at least a portion of exemplary intermediate processing steps in the fabrication of an illustrative LDMOS device having five gate segments (i.e., one control gate and four super gates), according to one or more embodiments of the present invention.

Figure 1:
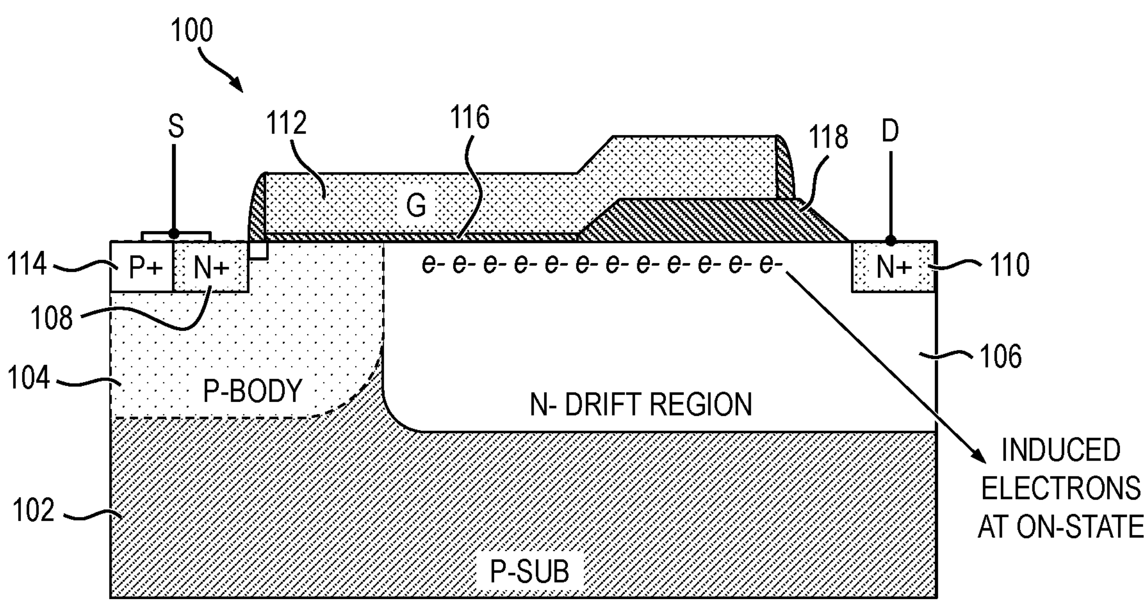
FIG. 1 is a cross-sectional view depicting at least a portion of an illustrative laterally-diffused metal-oxide semiconductor (LDMOS) device including a gate having a field plate extension.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of illustrative laterally-diffused metal-oxide semiconductor (LDMOS) devices, and methods for fabricating an LDMOS device, having a gate structure uniquely configured to enhance high-frequency performance without significantly degrading power and linearity performance in the device. It is to be appreciated, however, that the invention is not limited to the specific device(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term "LDMOS," as used herein, is intended to be construed broadly and to encompass any type of metal-insulator semiconductor device. The term LDMOS is, for example, intended to encompass semiconductor field-effect transistors that utilize an oxide material as their gate dielectric, as well as those that do not. In addition, despite a reference to the term "metal" in the acronym LDMOS, the term LDMOS is also intended to encompass semiconductor field-effect transistors wherein the gate comprises a non-metal material such as, for instance, polysilicon, as is more commonly used in integrated circuit (IC) fabrication.

Although the overall fabrication methods and structures formed thereby are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., Handbook of Compound Semiconductors: Growth, Processing, Characterization, and Devices, Cambridge University Press, 2008; and R. K. Willardson et al., Processing and Properties of Compound Semiconductors, Academic Press, 2001, which are incorporated by reference herein in their entireties. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure in order to provide a more clarified description. This does not imply, however, that the semiconductor layer(s) not explicitly shown are omitted in the actual IC device.

FIG. 1 is a cross-sectional view depicting at least a portion of an illustrative LDMOS device 100 including a gate having a field plate extension. Specifically, the LDMOS device 100 includes a substrate 102 which may be formed of single-crystalline silicon or other semiconductor material. The substrate 102 is preferably modified by adding an impurity or dopant (e.g., boron, phosphorus, arsenic, etc.) to change a conductivity of the material (e.g., n-type or p-type). In this example, since the LDMOS device 100 is an n-type transistor, the substrate 102 is of p-type conductivity and may thus be referred to as a p-substrate (P-SUB).

A body region 104, which in this embodiment is of p-type conductivity (p-body), is formed proximate the upper surface of the substrate 102, extending laterally from a source side toward a drain side of the device. A lightly-doped drift (LDD) region 106 is formed proximate the upper surface of the substrate 102 and laterally adjacent to the body region 104. The LDD region 106 has a conductivity type that is opposite that of the body region 104, in this example, n-type conductivity, and is therefore referred to herein as an n-type drain drift (NDD) region.

The LDMOS transistor 100 includes a source (S) region 108, a drain (D) region 110 and a gate (G) 112. The source and drain regions 108 and 110, respectively, are formed proximate an upper surface of the substrate 102 and spaced laterally from one another. The source and drain regions 108, 110 are preferably doped, such as by a conventional implant step, with an impurity of a known concentration level to selectively change the conductivity of the material as desired. In this example, the source and drain regions 108, 110 are of n-type conductivity (N+).

The source region 108 is formed in at least a portion of the body region 104, and the drain region 110 is formed in at least a portion of the NDD region 106. A heavily-doped region 114 having a conductivity type the same as the body region 104 (i.e., p-type (P+) in this example) is formed proximate the upper surface of the substrate 102, laterally adjacent to the source region 108 and within the body region, to form a body contact of the LDMOS device 100. The source region 108 is electrically connected to the body contact 114.

The gate 112 is formed between the source and drain regions 108, 110 and above at least a portion of the body region 104. A thin oxide layer 116 (e.g., silicon dioxide ($SiO_2$)), referred herein to as gate oxide, is formed under the gate 112 for electrically isolating the gate from the source and drain regions 108, 110 in the LDMOS device 100. As is well understood by those skilled in the art, a bias applied to the gate induces the formation of a channel in the body region 104 under the gate for controlling a current flow between the source region 108 and drain region 110.

As apparent from FIG. 1, the gate 112 is configured having a portion that extends laterally over the NDD region 106 and ends before the drain region 110. This extension of the gate 112 over the NDD region 106, which is formed on a dielectric layer 118 having a thickness that is greater compared to a thickness of the gate oxide layer 116, is typically referred to as a field plate. The field plate, which in this example is a continuous extension of the gate 112, functions to modulate an electric field in the LDMOS device 100, which increases the breakdown voltage of the device. The field plate also induces electrons to collect proximate an upper surface of the NDD region 106 during an on-state of the LDMOS device 100 (i.e., when the device is turned on), which reduces on-state resistance ($R_{DS\text{-}on}$) in the LDMOS device.

As previously explained, LDMOS power transistors have dominated high-power applications over the past years, particularly power amplifier applications used, for example, in wireless communication systems. While it is well-known to employ a field plate structure in a MOSFET device to increase the breakdown voltage of the device through modulation of the electric field locally, the additional parasitic feedback capacitance introduced by standard field plate structures undesirably impacts the overall high-frequency performance of the device and renders the device unsuitable for high-frequency applications without utilizing esoteric and costly materials and/or fabrication processes.

To meet the frequency performance criteria of modern high-frequency applications, it is desirable to reduce parasitic gate-to-drain capacitance, $C_{gd}$. In general, the capacitance, C, of a parallel plate capacitor is defined according to the following expression:

$$C = \varepsilon_0 \varepsilon_r \frac{A}{d},$$

where $\varepsilon_0$ is absolute permittivity (i.e., the permittivity of a vacuum $\varepsilon_0 = 8.854 \times 10^{-12}$ F/m), $\varepsilon_r$ is relative permittivity of the medium or dielectric material between the parallel plates (i.e., dielectric constant), A is the surface area of a side of each of the parallel plates, and d is a distance between the plates (i.e., a thickness of the dielectric material between the plates). Thus, in order to reduce the capacitance, the thickness of the dielectric material between the plates can be increased and/or the surface area of one or both plates can be reduced.

In order to achieve enhanced high-frequency performance in an LDMOS device without significantly impacting power and linearity performance in the device, the present invention, as manifested in one or more embodiments, is directed to an LDMOS device including a gate that is divided into multiple segments, thereby providing a unique structure having adjustable spacing between gate segments without any process limitations. The novel gate structure is configured to reduce overlap area between the gate and drain/drift region, thereby advantageously reducing parasitic gate-to-drain capacitance ($C_{gd}$) in the device.

Figure 2:
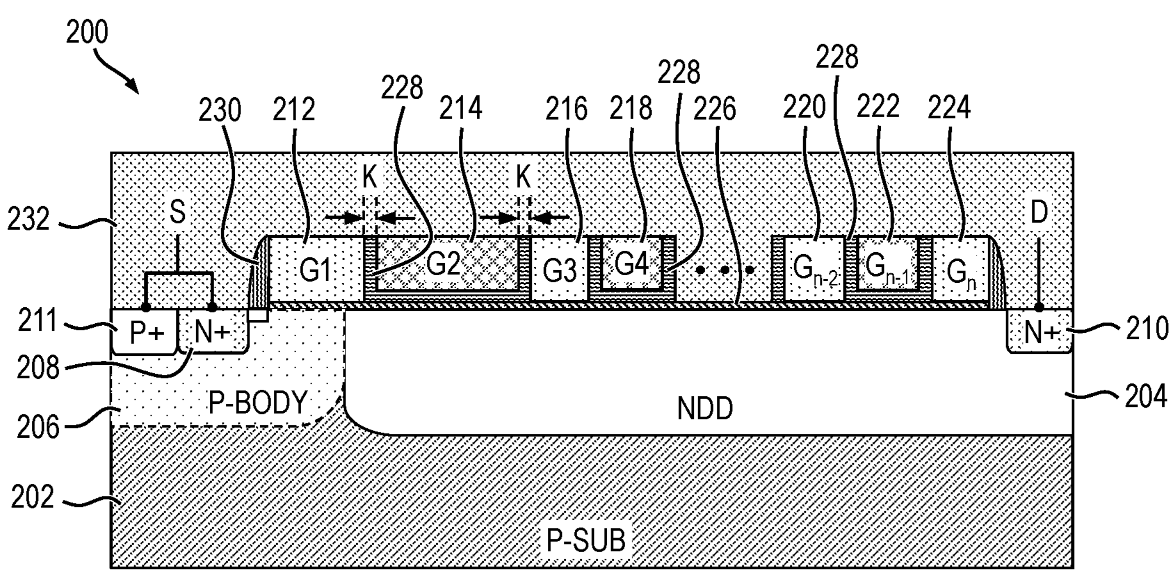
FIG. 2 is a cross-sectional view conceptually depicting at least a portion of an exemplary LDMOS device including an optimized gate structure having reduced parasitic capacitance, according to one or more embodiments of the present invention.

FIG. 2 is a cross-sectional view conceptually depicting at least a portion of an exemplary LDMOS device 200 including an optimized gate structure having reduced parasitic capacitance, according to one or more embodiments of the invention. More particularly, with reference to FIG. 2, the LDMOS device 200 includes a semiconductor substrate 202. The substrate 202, in one or more embodiments, is formed of single-crystalline silicon (e.g., having a <100> or <111> crystal orientation), although suitable alternative semiconductor materials may also be used, such as, but not limited to, germanium, silicon germanium, silicon carbide, gallium arsenide, gallium nitride, or the like. Additionally, in one or more embodiments the substrate 202 is preferably modified by adding an impurity or dopant (e.g., boron, phosphorus, arsenic, etc.) to change a conductivity of the material (e.g., n-type or p-type). In one or more embodiments, the substrate 202 is of p-type conductivity and may thus be referred to herein as a p-substrate (P-SUB). A p-substrate may be formed by adding a p-type impurity or dopant (e.g., Group III elements, such as boron) of a prescribed concentration level (e.g., about $10^{14}$ to about $10^{18}$ atoms per cubic centimeter) to the substrate material, such as by using a diffusion or implant step, to change the conductivity of the material as desired. Alternatively, in one or more embodiments an n-substrate may be formed by adding an n-type impurity or dopant (e.g., Group V elements, such as phosphorus) of a prescribed concentration level to the substrate material.

A lightly-doped drain drift or drain extension region 204 is formed on at least a portion of the substrate 202, proximate an upper surface thereof. The drain drift region 204 preferably has a conductivity type opposite in polarity to the conductivity type of the substrate 202. In one or more embodiments, when using a p-type substrate 202 the drain drift region 204 is of n-type conductivity, which may be formed by implanting an n-type impurity (e.g., phosphorus)

into a defined area of the substrate using standard CMOS fabrication techniques, and is therefore referred to herein as an n-type drain drift (NDD) region.

The doping concentration of the NDD region 204 is strongly correlated with the breakdown voltage of the LDMOS device 200, and thus by controlling the doping level of the NDD region 204, among other factors, a desired breakdown voltage can be achieved in the device. The breakdown voltage can be optimized, in one or more embodiments, by selectively adjusting the doping concentration profile of the NDD region 204, so that the doping concentration may be non-uniform throughout the NDD region (e.g., graduated, etc.).

A local low-resistivity body region 206 is formed in at least a portion of the NDD region 204. The body region 206 has a conductivity type that is opposite the conductivity type of the drain drift region 204. In one or more embodiments, the body region 206 comprises a p-type well (or p-well) disposed proximate an upper surface of the NDD region 204. The body region 206, in this exemplary embodiment, is formed by implanting a p-type impurity (e.g., boron) into a defined area of the NDD region 204 using standard CMOS fabrication techniques, and thus may be referred to as a P-body region. The body region 206, although being of the same conductivity type as the substrate 202, is preferably more heavily doped relative to the doping level of the substrate, such that the body region has a lower resistivity than the substrate (e.g., about 0.01 to 0.3 ohm-cm). In one or more alternative embodiments where an n-type substrate 202 is employed, the body region 206 may comprise an n-type well that is formed using similar CMOS fabrication techniques.

First and second heavily-doped regions having an opposite conductivity type/polarity (e.g., n-type) relative to the substrate 202 are formed proximate an upper surface of the LDMOS device 200 and define a source region 208 and drain region 210, respectively, of the LDMOS device; the source region is formed in the body region 206 and the drain region is formed in the NDD region 204. In one or more embodiments, the source and drain regions 208, 210 are comprised of heavily-doped n-type material formed using a standard implant process. Specifically, standard CMOS fabrication technology may implant the source region 208 and the drain region 210 with n-type material to form a first n+ region corresponding to the source region 208 and a second n+ region corresponding to the drain region 210. The n-type material includes impurity atoms of a donor type, such as, but not limited to, phosphorus, arsenic, antimony, or the like, that are capable of donating electrons. Implanting the source region 208 and/or the drain region 210 with the n-type material causes the carrier electron density in the source region 208 and/or the drain region 210 to exceed a carrier hole density.

A heavily-doped region 211 having a conductivity type the same as the body region 206 (p-type in this example), only having a higher dopant level than the body region, is formed in the body region, proximate the upper surface thereof and laterally adjacent to the source region 208, to form a body contact of the LDMOS device 200. The source region 208 is electrically connected to the heavily-doped region/body contact 211, for example during a subsequent metallization step, and forms a source (S) terminal of the LDMOS device 200. Likewise, a drain (D) terminal is formed, such as during the metallization step, to provide electrical connection to the drain region 210.

As apparent from FIG. 2, a gate structure is formed over at least a portion of the body region 206 and NDD region 204, proximate the upper surface of the LDMOS device 200 and between the source and drain regions 208, 210. In one or more embodiments, the gate structure is divided into a plurality of segments, including a first gate segment (G1) 212, a second gate segment (G2) 214, a third gate segment (G3) 216, a fourth gate segment (G4) 218, an (n−2)th gate segment ($G_{n-2}$) 220, an $(n-1)^{th}$ gate segment ($G_{n-1}$) 222, and an $n^{th}$ gate segment ($G_n$) 224, where n is an integer greater than or equal to two. The number of gate segments and length of each gate are determined by the electric field in a drift region (e.g., NDD region 204) in the device; a larger breakdown voltage device will have a longer drift region, thus having more opportunities to adjust the number of gate segments and gate length. However, it is to be appreciated that embodiments of the invention are not limited to any specific number of gate segments employed.

The gate structure, comprising gate segments 212 through 224, is electrically isolated from the NDD region 204 and body region 206 by a thin insulating (i.e., dielectric) layer 226 disposed on the upper surface of the wafer on which the gate structure is formed. The thin insulating layer 226 may, in some embodiments, be formed of an oxide (e.g., silicon dioxide), and is thus referred to herein as a gate oxide layer. Additionally, a thin dielectric layer 228 is preferably formed between adjacent gate segments 212 through 224. Dielectric spacers 230 may be formed on sidewalls of the outer (i.e., end) gate segments, 212 and 224 in this illustrative embodiment, for electrically isolating the gate structure from adjacent structures which may be fabricated on the same wafer. An insulating encapsulation layer 232 is preferably formed (e.g., by standard oxide deposition or the like) over the upper surface of the wafer to electrically isolate device elements and/or connections formed on the wafer from one another during subsequent metallization or other back-end of line (BEOL) processing.

In one or more embodiments, the dielectric layer 228 separating adjacent gate segments is formed during a different process step than the insulating layer 226 (i.e., using different photolithographic mask layers), and thus the properties (e.g., material type, thickness, etc.) of the insulating layer 226 and dielectric layer 228 can be independently controlled. For example, the dielectric layer 228 may be formed of a different material (e.g., nitride) and/or thickness compared to the insulating layer 226 (e.g., oxide), although the two layers 226, 228 may, in some embodiments, be formed of the same material and/or thickness.

Advantageously, in accordance with aspects of the invention, a spacing, K, between adjacent gate segments can be selectively controlled without any process limitations (e.g., minimum process dimensions) and separate from the thickness of the insulating layer 226. If all the gate segments are formed using one mask, the spacing K would be limited by polysilicon gate photolithography limitations (e.g., like 110 nm for 110-nm node technology). Embodiments of the present invention do not have this limitation, because gate segments G2 214, G4 218 and $G_{n-1}$ 222 are formed in a different process step from gate segments G1 212, G3 216, $G_{n-2}$ 220 and $G_n$ 224. For example, the photolithographic spacing limit between gate segments G2 214 and G4 218 is $(2 \cdot K + W_{G3})$, where K is the spacing and $W_{G3}$ is the width (lateral) of gate segment G3.

With continued reference to FIG. 2, the first gate segment 212, disposed above the body region 206, is defined as a control gate (i.e., "real" gate), which controls the formation of a channel and/or modulation of channel width in the body region beneath the first gate segment 212 for controlling current flow between the drain region 210 and source region

208 in the LDMOS device 200. The current flowing through the channel between the drain and source regions 210, 208 is proportional to the input voltage potential applied to the control gate segment 212. More particularly, as will be understood by those skilled in the art, when a bias voltage is applied between the control gate segment 212 and source region 208, an inversion layer or channel is induced in the body region 206 under the gate oxide layer 226 via a field effect principle. The channel is operative to facilitate a flow of current between the source and drain regions 208, 210 of the LDMOS device 200, a magnitude of the current being controlled as a function of the applied voltage. The remaining gate segments, G2 through $G_n$ (referred to herein as "super" gates), distributed across the upper surface of the NDD region 204, can each be biased at different voltage potentials, depending on the intended function.

For instance, when a given one of the super gate segments 214 through 224 is biased at the same voltage potential as the source region 208 (e.g., ground potential), the given super gate segment functions to shield the parasitic gate-to-drain capacitance $C_{gd}$ (i.e., Miller capacitance), thereby beneficially reducing parasitic capacitance and improving high-frequency performance of the LDMOS device 200. Likewise, when the given one of the super gate segments 214 through 224 is biased at the same voltage potential as the control gate segment 212, the given super gate segment functions to assist in accumulating electrons in the NDD region 204 (under the given super gate segment) during an on-state of the LDMOS device 200, thereby beneficially reducing on-state resistance in the LDMOS device.

During fabrication, the gate segments 212 through 224 are preferably formed using at least two different photolithographic masks. In one or more embodiments, a first mask (mask-A) is used to form odd-numbered gate segments, including gate segments 212, 216, 220 and 224, and a second mask (mask-B) is used to form even-numbered gate segments, including gate segments 214, 218 and 222; that is, alternating adjacent gate segments are formed using different masks.

The gate segments 212, 214, 216, 218, 220 and 224 collectively defining the gate structure in the LDMOS device 200 are preferably formed of heavily-doped polysilicon, although other materials for forming the gate are similarly contemplated (e.g., a metal). The materials and/or implant compositions (e.g., polysilicon, n-type or p-type doped polysilicon, metal, etc.) used for mask-A and mask-B processing can be the same or different. For instance, n-type polysilicon can be used for both mask-A and mask-B gate segments, or n-type polysilicon for mask-A gate segments and p-type polysilicon for mask-B gate segments, or metal for mask-A gate segments and polysilicon for mask-B gate segments, etc. Embodiments of the invention are not limited to any specific materials and/or material combinations used for forming the gate segments 212, 214, 216, 218, 220 and 224.

Figure 3A:
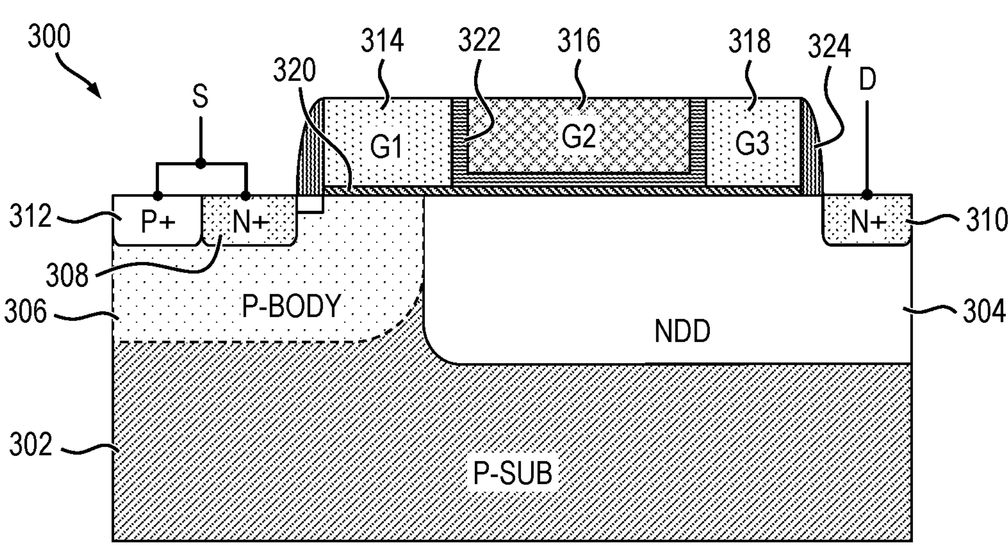
FIGS. 3A and 3B are cross-sectional views depicting at least a portion of an exemplary LDMOS device including a gate structure having a reduced number of gate segments, compared to the illustrative LDMOS device shown in FIG. 2, and an exemplary biasing arrangement for the LDMOS device, respectively, according to one or more embodiments of the present invention.
Figure 3B:
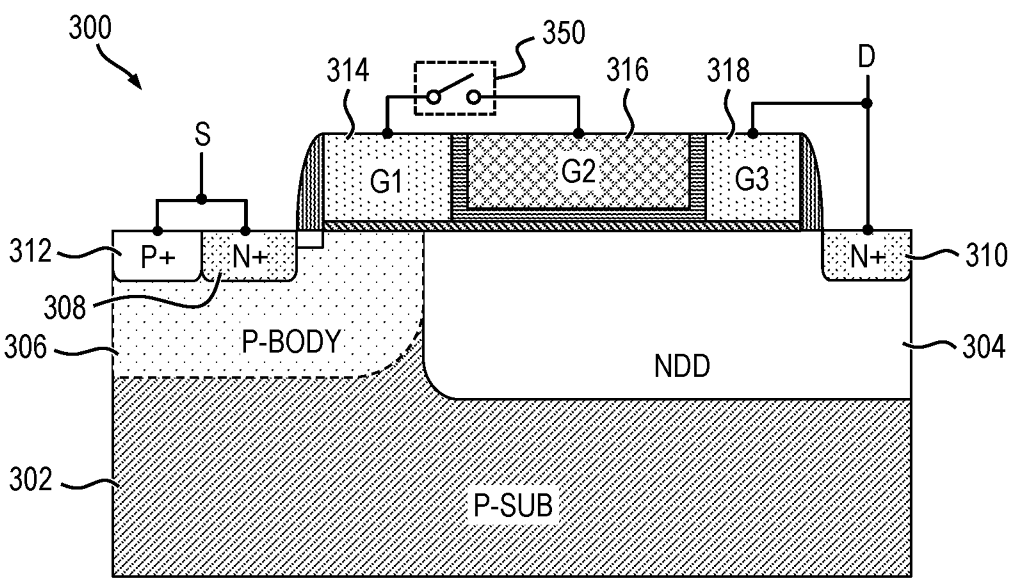

In some embodiments, such as, for example, medium voltage applications, only a small subset of super gate segments (e.g., two or three) is sufficient to achieve desired LDMOS device performance enhancements. (As used herein, although there is no strict definition for "medium voltage," the term "low voltage" typically refers to a breakdown voltage lower than about 30 volts, "medium voltage" typically refers to a breakdown voltage between 30-100 volts, and "high voltage" typically refers to a breakdown voltage higher than 100 volts.) By way of illustration only and without limitation, FIGS. 3A and 3B are cross-sectional views depicting at least a portion of an exemplary LDMOS device 300 including a gate structure having a reduced number of gate segments, compared to the LDMOS device 200 shown in FIG. 2, and an exemplary biasing arrangement, respectively, according to one or more embodiments of the invention. With reference to FIG. 3A, the LDMOS device 300 comprises a semiconductor substrate 302 which, in one or more embodiments, is formed of single-crystalline silicon (e.g., having a <100> or <111> crystal orientation), although suitable alternative semiconductor materials may also be used (e.g., germanium, silicon germanium, gallium arsenide, etc.). The substrate 302 is preferably modified by adding an impurity or dopant (e.g., boron, phosphorus, arsenic, etc.) to change a conductivity of the material, as previously stated. In this illustrative embodiment, the substrate 302 is of p-type conductivity and is thus referred to herein as a p-substrate (P-SUB).

A lightly-doped drain drift or drain extension region 304 is formed on at least a portion of the substrate 302, proximate an upper surface thereof. In one or more embodiments, when using a p-type substrate 302 the drain drift region 304 is of n-type conductivity, and is therefore referred to herein as an n-type drain drift (NDD) region. Like in the LDMOS device 200 shown in FIG. 2, the doping concentration of the NDD region 304 is strongly correlated with the breakdown voltage of the LDMOS device 300, and thus by controlling the doping level of the NDD region 304, among other factors, the breakdown voltage in the device can be selectively controlled. It is to be appreciated that in one or more embodiments, the doping concentration may be non-uniform throughout the NDD region 304 (e.g., graduated, etc.).

A local low-resistivity body region 306 is formed in at least a portion of the NDD region 304. The body region 306 has a conductivity type that is opposite the conductivity type of the drain drift region 204. In one or more embodiments, the body region 306 comprises a p-type well (or p-well) disposed proximate an upper surface of the NDD region 304. The body region 306, in this exemplary embodiment, is formed by implanting a p-type impurity (e.g., boron) into a defined area of the NDD region 304 using standard CMOS fabrication techniques, and thus may be referred to as a P-body region. The body region 306 is preferably more heavily doped relative to the doping level of the substrate, such that the body region has a lower resistivity than the substrate (e.g., about 0.01 to 0.3 Ω-cm). In one or more alternative embodiments where an n-type substrate 302 is employed, the body region 306 may comprise an n-type well that is formed using similar CMOS fabrication techniques.

First and second heavily-doped regions having an opposite conductivity type/polarity (e.g., n-type) relative to the substrate 302 are formed proximate an upper surface of the LDMOS device 300 and define a source region 308 and a drain region 310, respectively, of the LDMOS device; the source region is formed in the body region 306 and the drain region is formed in the NDD region 304. In one or more embodiments, the source and drain regions 308, 310 are comprised of heavily-doped n-type material formed using a standard implant process. Implanting the source region 308 and/or the drain region 310 with n-type material causes the carrier electron density in the source region 308 and/or the drain region 310 to exceed a carrier hole density.

A heavily-doped region 312 having a conductivity type the same as the body region 306 (p-type in this example), only having a higher dopant level than the body region, is formed in the body region, proximate the upper surface thereof and laterally adjacent to the source region 308, to form a body contact of the LDMOS device 300. The source region 308 is electrically connected to the heavily-doped region/body contact 312, for example during a subsequent metallization step, and forms a source (S) terminal of the LDMOS device 300. Likewise, a drain (D) terminal is formed, such as during the metallization step, to provide electrical connection to the drain region 310.

A gate structure is formed over at least a portion of the body region 306 and NDD region 304, proximate the upper surface of the LDMOS device 300 and between the source and drain regions 308, 310. As previously described in conjunction with the LDMOS device depicted in FIG. 2, the gate structure is fabricated as a plurality of segments. In the exemplary LDMOS device 300, the gate structure includes a first gate segment (G1) 314, a second gate segment (G2) 316, and a third gate segment (G3) 318.

The gate segments 314, 316 and 318 are electrically isolated from the NDD region 304 and body region 306 by a thin insulating (i.e., dielectric) layer 320 disposed on the upper surface of the wafer on which the gate structure is formed. The thin insulating layer 320 may, in some embodiments, be formed of an oxide (e.g., silicon dioxide), and is thus referred to herein as a gate oxide layer. Additionally, a thin dielectric layer 322 is preferably formed between adjacent gate segments 314, 316, 318. Optionally, dielectric spacers 324 may be formed on sidewalls of the outer (i.e., end) gate segments, 314 and 318 in this illustrative embodiment, for electrically isolating the gate structure from adjacent structures which may be fabricated on the same wafer.

As previously stated, the dielectric layer 322 separating adjacent gate segments (e.g., 314 and 316, or 316 and 318) is preferably formed during a different process step than the gate oxide layer 320 (i.e., using different photolithographic masks), and thus the properties (e.g., material type, thickness, etc.) of the gate oxide layer 320 and dielectric layer 322 can be independently controlled. For example, the dielectric layer 322 may be formed of a different material (e.g., nitride) and/or thickness compared to the gate oxide layer 320, in one or more embodiments. In this manner, a spacing between adjacent gate segments can be selectively controlled without any process limitations and separate from the thickness of the gate oxide layer 320.

With continued reference to FIG. 3A, the first gate segment 314, disposed above the body region 306, is defined as a control gate (i.e., "real" gate), which controls the formation of a channel and/or modulation of channel width in the body region beneath the first gate segment 314 for controlling current flow between the drain region 310 and source region 308 in the LDMOS device 300. In a manner similar to the LDMOS device 200 shown in FIG. 2, the current flowing through the channel between the drain and source regions 310, 308 in the LDMOS device 300 is proportional to the input voltage potential applied to the control gate segment 314. The remaining gate segments, 316 and 318, are referred to herein as super gates, which are distributed across the upper surface of the NDD region 304. Each of the super gates 316, 318 can be freely biased to any voltage potential, depending on the intended function.

By way of illustration only and without limitation, FIG. 3B is a cross-sectional view depicting at least a portion of the LDMOS device 300 shown in FIG. 3A, connected in an exemplary biasing arrangement, according to one or more embodiments of the invention. As apparent from FIG. 3B, super gate G3 318 is connected to the drain terminal of the LDMOS device 300, and super gate G2 316 is connected to the control gate G1 314 through a switch 350, represented symbolically as a single-pole single-throw (SPST) switch. The switch 350 is closed (i.e., "on") when the LDMOS device 300 is turned on, thus acting as a low-impedance element (e.g., on the order of $10^{-3}$ ohms); ideally, near zero resistance. When the LDMOS device 300 is turned off, the switch 350 is open (i.e., "off"), thus functioning as a high-impedance element (e.g., on the order of about $10^{6}$ ohms); ideally, near infinite resistance.

Figure 3C:
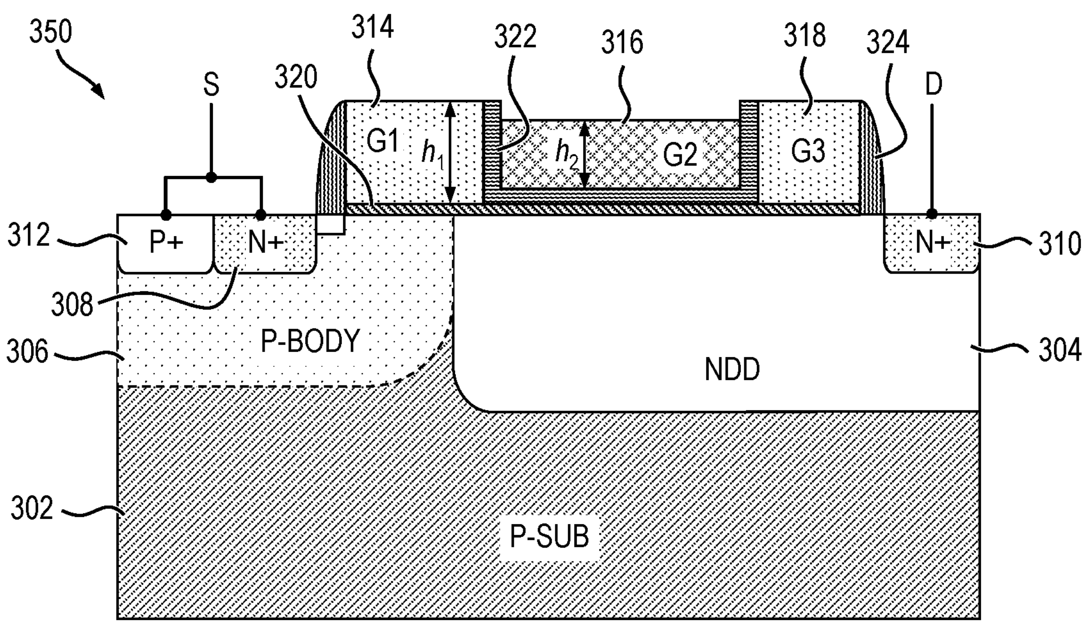
FIG. 3C is a cross-sectional view depicting at least a portion of the exemplary LDMOS device shown in FIG. 3A including a gate structure comprising gate segments having different heights, according to one or more embodiments of the present invention.

Although the gate segments 314, 316 and 318 of the LDMOS device 300 shown in FIG. 3A all have the same vertical height, embodiments of the invention contemplate gate segments having different heights. By way of example only and without limitation, FIG. 3C is a cross-sectional view depicting at least a portion of an exemplary LDMOS device 350 including a gate structure comprising gate segments having different heights, according to one or more embodiments of the invention. As apparent from FIG. 3C, the LDMOS device 350 is essentially the same as the exemplary LDMOS device 300 shown in FIG. 3A, except that a vertical (i.e., cross-sectional) height, h1, of a first subset of gate segments, including gate segments 314 (G1) and 318 (G3), is greater than a height, h2, of a second subset of gate segments, including gate segment 316 (G2). Alternatively, in one or more other embodiments, the height h2 of the second subset of gate segments may be greater than the height h1 of the first subset of gate segments.

Figure 4:
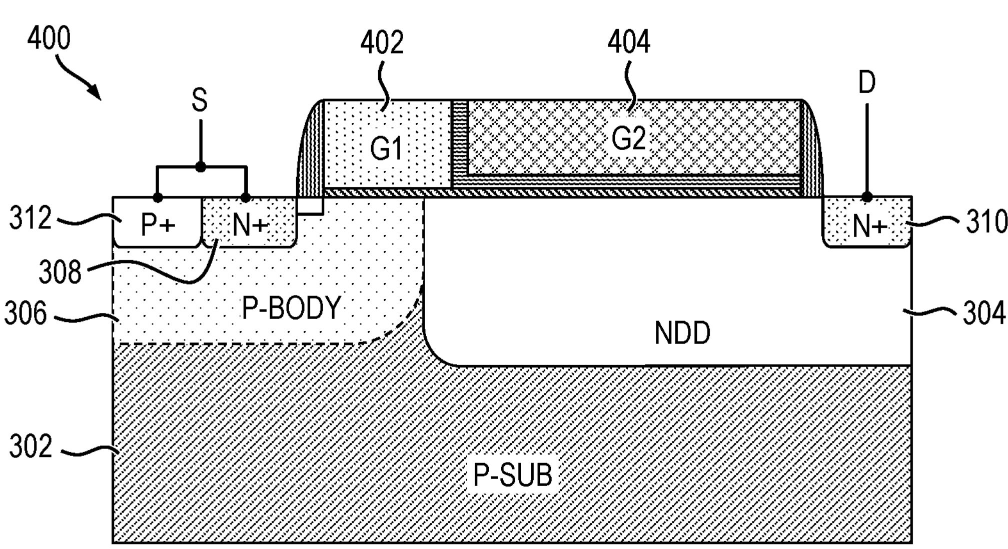
FIG. 4 is a cross-sectional view depicting at least a portion of an exemplary LDMOS device including a gate structure having reduced parasitic capacitance and optimized for lower voltage applications, according to one or more embodiments of the present invention.

In an alternative embodiment, which may be well-suited for use in lower voltage applications, only two gate segments are employed. FIG. 4 is a cross-sectional view depicting at least a portion of an exemplary LDMOS device 400 including a gate structure having reduced parasitic capacitance and optimized for lower voltage applications, according to one or more embodiments of the invention. The LDMOS device 400 is essentially the same as the illustrative LDMOS device 300 shown in FIG. 3A, except that the gate structure has been modified for use in lower voltage applications.

Specifically, in the LDMOS device 400, a gate structure is formed over at least a portion of the body region 306 and NDD region 304, proximate the upper surface of the LDMOS device 300 and between the source and drain regions 308, 310. In this exemplary embodiment, the gate structure is fabricated with two gate segments, namely, a first gate segment (G1) 402, and a second gate segment (G2) 404, thereby omitting the third gate segment 318 included in the gate structure of the LDMOS device 300 of FIG. 3A. The first gate segment G1 402, disposed over the body region 306, is defined as a control gate (i.e., "real" gate), which controls the formation of the channel and/or modulation of channel width in the body region beneath the first gate segment 402 for controlling current flow between the drain region 310 and source region 308 in the LDMOS device 400. The second gate segment G2 404, disposed over the NDD region 304, is referred to herein as a super gate.

The control gate segment 402 is formed from a different photolithographic mask than the super gate segment 404, in one or more embodiments. In this manner, a spacing between the gate segments 402, 404, which will be a function of the thickness of the dielectric layer (322 in FIG. 3A), can be controlled independently of the gate oxide layer (320 in FIG. 3A) and is not limited to minimum size and spacing parameters of the IC fabrication process technology employed. The super gate 404, like the super gates 316 and 318 in the LDMOS device 300 shown in FIG. 3A, can be freely biased to any voltage potential, depending on the intended function.

In some embodiments, in order to improve breakdown voltage performance in the LDMOS device, an isolation structure can be included in the device. The isolation structure, which may be implemented in the form of a shallow trench isolation (STI) structure, local oxidation of silicon (LOCOS) structure, step oxide, etc., is configured to increase a vertical spacing between the super gate segment (s) and the NDD region in the LDMOS device, as will be described further in conjunction with FIGS. 5-7.

Figure 5:
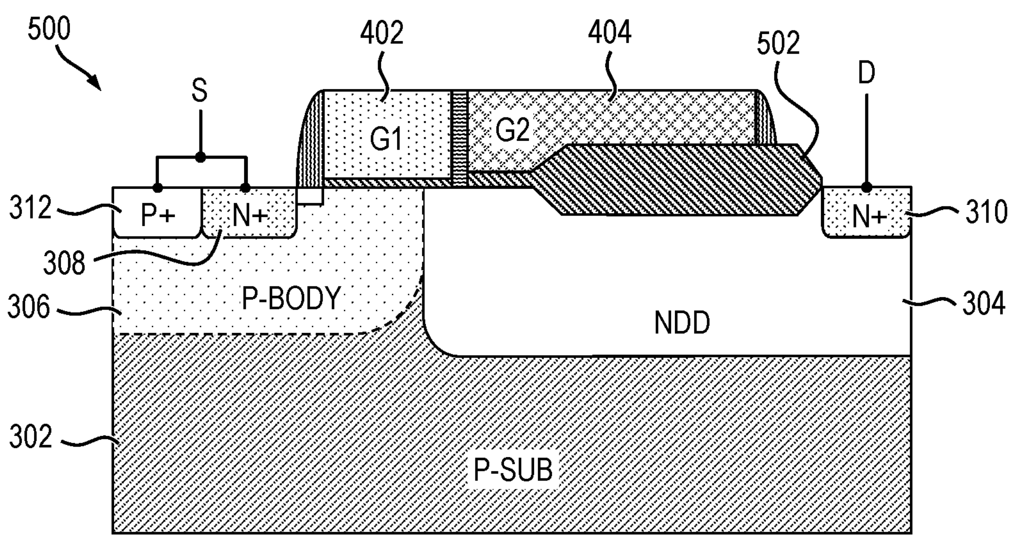
FIGS. 5-7 are cross-sectional views depicting at least a portion of exemplary LDMOS devices including different arrangements of isolation structures, according to embodiments of the present invention.
Figure 6:
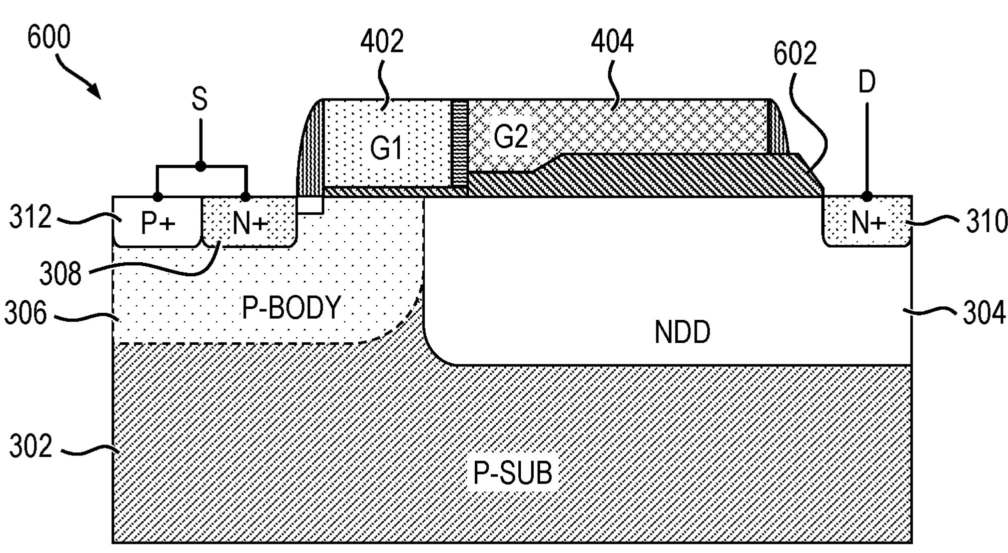
Figure 7:
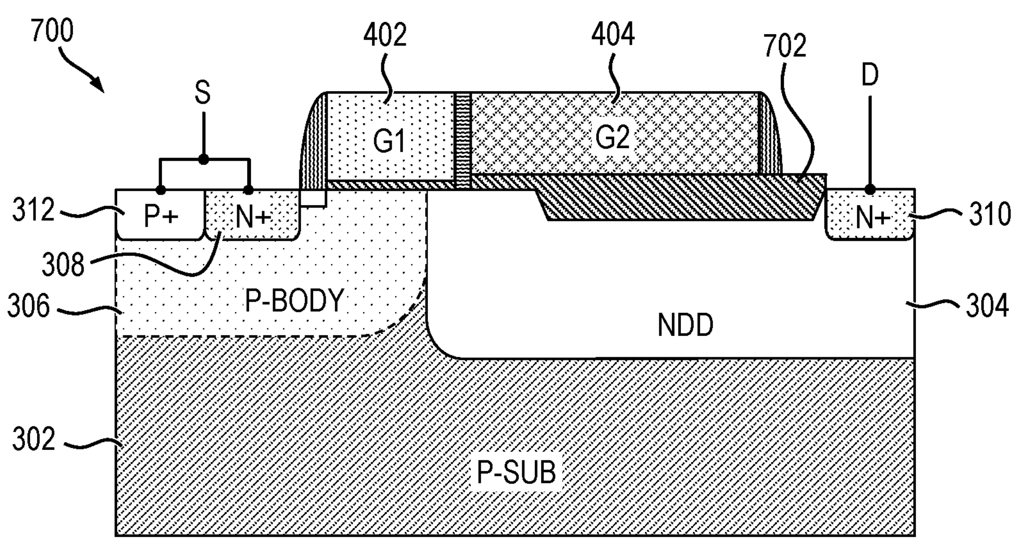

By way of example only and without limitation, FIGS. 5-7 are cross-sectional views depicting at least a portion of exemplary LDMOS devices including different arrangements of isolation structures, according to embodiments of the invention. Each of the exemplary LDMOS devices depicted in FIGS. 5-7 is essentially the same as the illustrative LDMOS device 400 shown in FIG. 4, except for the addition of the isolation structure to enhance breakdown voltage in the device, as previously stated. Specifically, FIG. 5 illustrates an exemplary LDMOS device 500 including a LOCOS isolation structure, FIG. 6 illustrates an exemplary LDMOS device 600 including a step oxide isolation structure, and FIG. 7 illustrates an exemplary LDMOS device 700 including an STI structure.

With reference to FIG. 5, the LDMOS device 500 includes a LOCOS structure 502 formed in the NDD region 304, isolating the super gate G2 404 from the NDD region. The LOCOS structure 502 may be formed of an oxide (e.g., silicon dioxide) using standard LOCOS isolation techniques known by those skilled in the art. At least a portion of the super gate G2 404 is formed on an upper surface of the LOCOS structure 502, so that an end of the super gate G2 extending toward the drain region 310 is disposed a greater distance above the NDD region 304 compared to an end of the super gate G2 adjacent to the control gate G1 402.

Referring now to FIG. 6, the LDMOS device 600 includes a step oxide structure 602 formed on an upper surface of the NDD region 304, extending from the dielectric layer (322 in FIG. 3A) separating the gate segments 402, 404, to the drain region 310. The step oxide structure 602, in one or more embodiments, comprises silicon dioxide, or a similar oxide material, having a thickness that is greater at an end extending toward the drain region 310 compared to its thickness at an opposing end extending toward the source region 308. The super gate G2 404 is formed on an upper surface of the step oxide structure 602, so that, as in the LDMOS device 500 shown in FIG. 5, an end of the super gate G2 extending toward the drain region 310 is disposed a greater height above the NDD region 304 compared to an end of the super gate G2 adjacent to the control gate G1 402.

As shown in FIG. 7, the LDMOS device 700 includes an STI structure 702 formed in at least a portion of the NDD region 304, proximate the upper surface thereof. The STI structure 702 may not necessarily be planar with the upper surface of the NDD region 304, but may extend slightly above the upper surface of the NDD region, in some embodiments. The STI structure 702, which extends from the dielectric layer (322 in FIG. 3A) separating the gate segments 402, 404, to the drain region 310, can be formed using standard STI fabrication techniques known to those skilled in the art. The STI structure 702, in one or more embodiments, comprises silicon dioxide, although embodiments of the invention are not limited to any specific material for forming the STI structure. A thickness of the STI structure 702 is greater at an end extending toward the drain region 310 compared to its thickness at an opposing end extending toward the source region 308. The super gate G2 404 is formed on an upper surface of the STI structure 702, so that, as in the LDMOS devices 500 and 600 shown in FIGS. 5 and 6, respectively, an end of the super gate G2 extending toward the drain region 310 is at a greater height above the NDD region 304 compared to an end of the super gate G2 adjacent to the control gate G1 402.

Advantageously, the high-frequency LDMOS device according to embodiments of the invention is entirely compatible with standard CMOS fabrication process technology and materials. By way of example only and without limitation, FIGS. 8A-8F are cross-sectional views depicting at least a portion of exemplary intermediate processing steps 800A-800F in the fabrication of an illustrative LDMOS device having five gate segments (i.e., one control gate and four super gates), according to one or more embodiments of the invention.

Figure 8A:
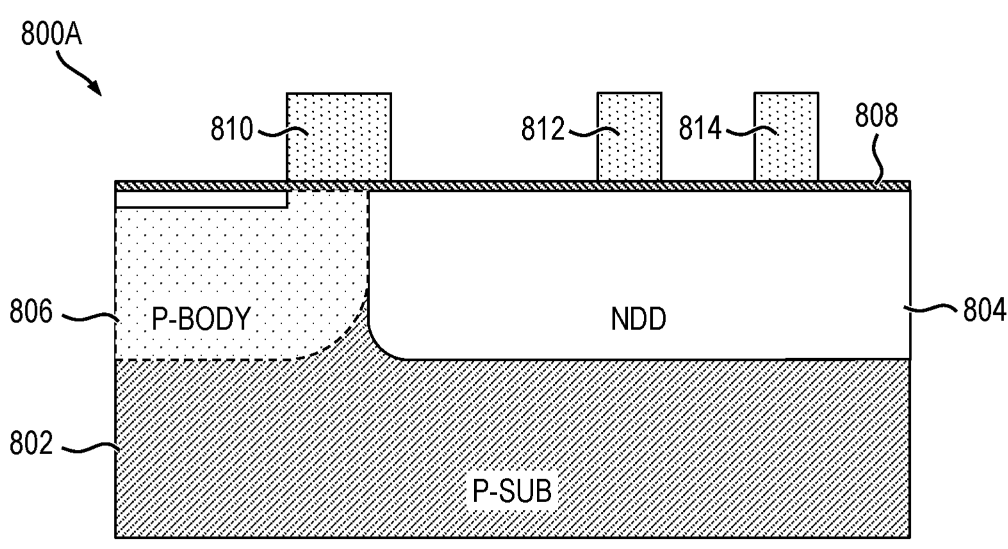

With reference to FIG. 8A, the illustrative fabrication process step 800A starts with a substrate 802, which in one or more embodiments comprises single-crystalline silicon or an alternative semiconductor material, such as, but not limited to, germanium, silicon germanium, silicon carbide, gallium arsenide, gallium nitride, or the like. In this illustrative embodiment, the substrate 802 is doped with a p-type impurity or dopant (e.g., boron, phosphorus, arsenic, etc.) to form a p-type conductivity substrate, or p-substrate (P-SUB). Embodiments of the invention are also contemplated in which an n-type conductivity substrate is employed. An NDD region 804 is formed on the upper surface of at least a portion of the substrate 802, such as by doping a defined region of the substrate (e.g., by photolithographic patterning) with an n-type dopant. The NDD region 804 is preferably formed, in one or more embodiments, using an implantation process, such as, for example, ion implantation.

A doped body region 806 is formed in a portion of the NDD region 804, proximate the upper surface of the NDD region. In this example, the body region 806 is doped with an impurity having a conductivity type opposite to the conductivity type of the NDD region (i.e., a p-type impurity), and thereby forms a p-body of the LDMOS device. The body region 806 is preferably formed using an implant process, such as, for example, ion implantation, often followed by annealing at a prescribed temperature to drive and distribute the impurity in the NDD region 804.

A thin insulating (gate oxide) layer 808 is formed on an upper surface of the wafer, such as by oxidizing the wafer. The thin insulating layer 808 preferably comprises silicon dioxide ($SiO_2$), in one or more embodiments, and thereby functions as a gate oxide layer. The chemical reaction between oxygen and silicon in the NDD region 804 and body region 806 will generate $SiO_2$ forming the gate oxide layer 808 is typically driven by a high-heat environment (e.g., about 800 degrees Celsius (° C.) to 1200° C.); however, even at room temperature, a shallow layer of native oxide (e.g., about 1 nanometer (nm) thick) can form in an air environment. In order to grow thicker oxides in a controlled environment, several known methods can be used, such as, for example, plasma-enhanced chemical vapor deposition (PECVD).

An inversion layer or channel is established in the body region 806 under the gate oxide layer 808 of the LDMOS device upon application of a prescribed bias voltage (e.g., at least equal to a threshold voltage, $V_t$, of the LDMOS device) between a gate and source region (subsequently formed) of the LDMOS device. The channel is operative to facilitate a flow of current between the source and drain regions (e.g., 208 and 210, respectively, in FIG. 2) in the LDMOS device as a function of the applied bias voltage.

A layer of polysilicon is then deposited on at least a portion of an upper surface of the gate oxide layer 808. The polysilicon layer, after photolithographic patterning and etching, forms a plurality of gate segments, 810, 812 and 814, which will become a first subset of a larger plurality of gate segments subsequently forming a gate structure of the LDMOS device, as previously described in conjunction with FIG. 2. The gate segments 810, 812, 814 may be referred to herein as first gate segments, and the layer of polysilicon may be referred to as first gate material layer, since this layer is not necessarily limited to polysilicon.

Figure 8B:
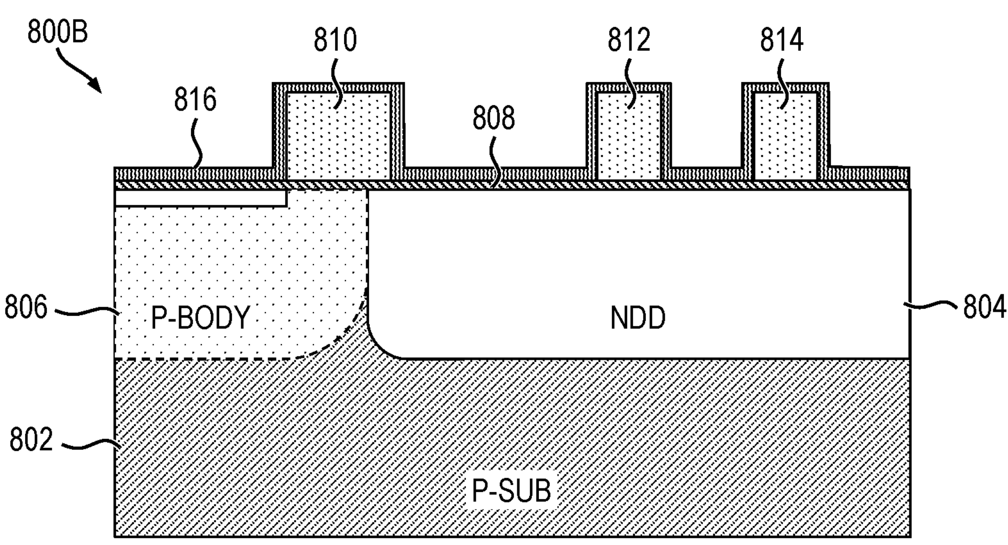

Referring now to FIG. 8B, illustrative process step 800B involves forming a dielectric layer 816 on the upper surface of the wafer, including an upper surface of exposed portions of the gate oxide layer 808, and covering sidewalls and an upper surface of the patterned polysilicon gate segments 810, 812, 814. In one or more embodiments, the dielectric layer 816 comprises an oxide (e.g., $SiO_2$), although embodiments of the invention are not limited to an oxide. The dielectric layer 816 may be formed, in some embodiments, by deposition or a thermal process (e.g., thermal oxidation). A thickness of the dielectric layer 816 is selectively controlled independently of the thickness of the gate oxide layer 808, as previously explained, and is not restricted to a minimum line dimension of the fabrication process. In one or more embodiments, a thickness of the dielectric layer 816 is about 2-50 nanometers (nm).

Figures 8C, 8D:
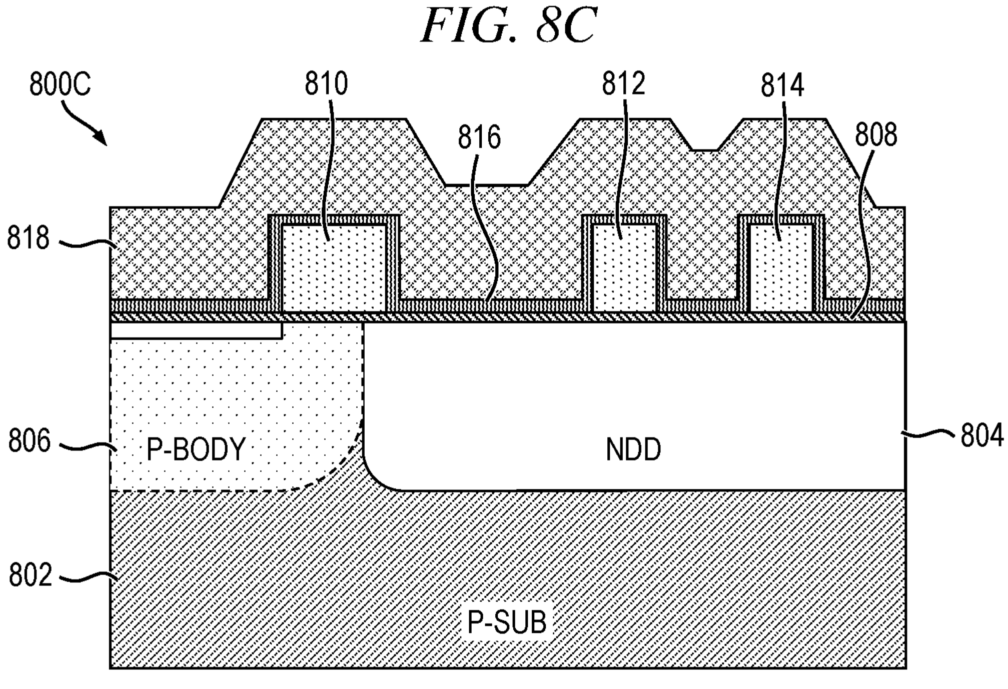

FIG. 8C depicts the process step 800C in the fabrication of the illustrative LDMOS device, according to one or more embodiments of the invention. In step 800C, a second gate material layer 818 is deposited on at least a portion of an upper surface of the dielectric layer 816. The second gate material layer 818 may be formed using a standard deposition process, in one or more embodiments. As previously stated, the second gate material layer 818 is not necessarily formed of the same material and/or implant type as the material forming the gate segments 810, 812 and 814. For example, the gate segments 810, 812, 814 may comprise polysilicon and the second gate material layer 818 may comprise metal, polysilicon (doped with n-type or p-type implant, or undoped/neutral), etc. In one or more embodiments, the second gate material layer 818 comprises p-type polysilicon, which beneficially assists in depleting the NDD region 804.

The second gate material layer 818 is planarized in process step 800D, as shown in FIG. 8D. In one or more embodiments, chemical-mechanical polishing (CMP) is used to planarize the second gate material layer 818. As will be known by those skilled in the art, CMP is a process of smoothing a surface by applying chemical and mechanical forces. The dielectric layer 816 is preferably used as a stop layer during the CMP process. In alternative embodiments, selective etching may be used to planarize the second gate material layer 818, with the dielectric layer 816 used as an etch-stop layer.

Figures 8E, 8F:
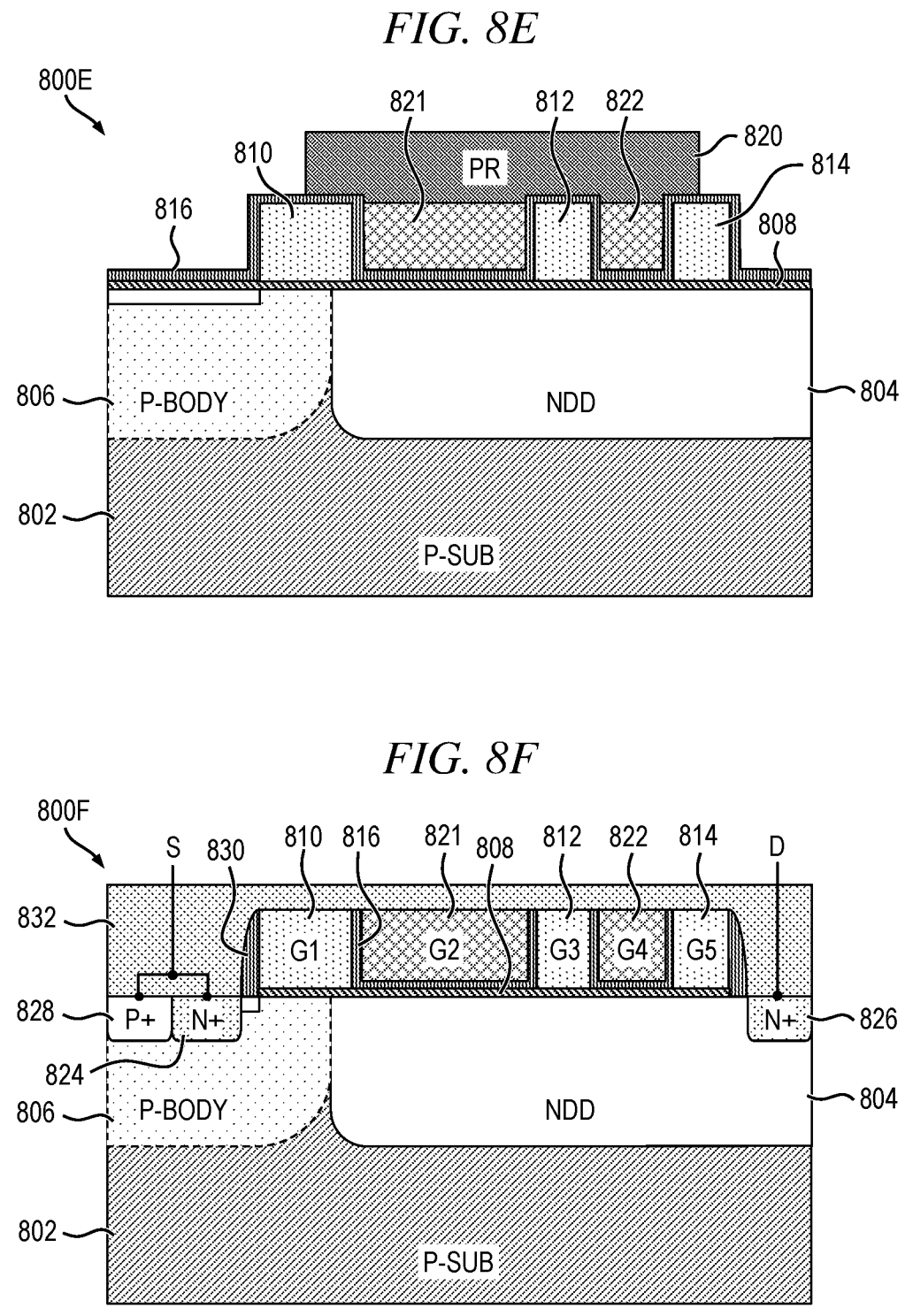

With reference to FIG. 8E, process step 800E involves forming a photoresist layer 820 on the wafer, including on at least a portion of the upper surface of the dielectric layer 816 and on a portion of an upper surface of the second gate material layer 818 above the NDD region 804. Portions of the second gate material layer (818 in FIG. 8D) not protected by the photoresist layer 820 (beyond the outer gate segments 810 and 814) are removed using a subsequent etch process. The etchant used for the etching process is preferably selective to the material used to form the second gate material layer (818 in FIG. 8D). After etching, the second gate material layer will form a plurality of gate segments 821 and 822, which will become a second subset of the larger plurality of gate segments. The second subset of gate segments 821, 822 are interposed between the first subset of gate segments 810, 812 and 814, collectively forming the gate structure of the LDMOS device.

In process step 800F shown in FIG. 8F, the photoresist layer 820 is removed, such as by etching or planarizing (e.g., CMP). The portion of the dielectric layer 816 covering upper surfaces of the gate segments 810, 812, 814, 821 and 822 is also removed, such as by using an etching or planarizing process to thereby expose the upper surfaces of the respective gate segments. First and second heavily-doped regions having an opposite conductivity type/polarity (e.g., n-type) relative to the substrate 802 are formed proximate an upper surface of the LDMOS device and define a source region 824 and drain region 826, respectively, of the LDMOS device; the source region is formed in the body region 806 and the drain region is formed in the NDD region 804.

In one or more embodiments, the source and drain regions 824, 826 are comprised of heavily-doped n-type material formed using a standard implant process. Specifically, standard CMOS fabrication technology may implant the source region 824 and the drain region 826 with n-type material to form a first n+ region corresponding to the source region 824 and a second n+ region corresponding to the drain region 826. The n-type material includes impurity atoms of a donor type, such as, but not limited to, phosphorus, arsenic, antimony, or the like, that are capable of donating electrons.

A heavily-doped region 828 having a conductivity type the same as the body region 806 (p-type in this example), only having a higher dopant level than the body region, is formed in the body region, proximate the upper surface thereof and laterally adjacent to the source region 824, to form a body contact of the LDMOS device. The source region 824 is electrically connected to the heavily-doped region/body contact 828, for example during a subsequent metallization step, and forms a source (S) terminal of the LDMOS device. Likewise, a drain (D) terminal is formed, such as during the metallization step, to provide electrical connection to the drain region 826.

With continued reference to FIG. 8F, dielectric spacers 830 may be formed on sidewalls of the outer (i.e., end) gate segments, 810 and 814 in this illustrative embodiment, for electrically isolating the gate structure from adjacent structures which may be fabricated on the same wafer.

Optionally, a silicide layer (not explicitly shown, but implied) may be formed on upper surfaces of the source and drain regions 824, 826, as well as upper surface of the respective gate segments 810, 812, 814, 821 and 822. The silicide layer can be formed using a standard silicide formation technique, as will be known by those skilled in the art. Silicide, which is a compound of silicon and metal, is preferably formed on the gate segments 810, 812, 814, 821, 822, and source and drain regions 824, 826 in order to reduce contact resistance to metal wiring layers subsequently formed during BEOL processing. This silicide formation also has the effect of beneficially lowering the resistance of each electrode in the LDMOS device.

An insulating encapsulation layer 832 is preferably formed (e.g., by standard oxide deposition or the like) over the upper surface of the wafer to electrically isolate device elements and/or connections formed on the wafer from one another during subsequent metallization or other BEOL processing.

Figure 9:
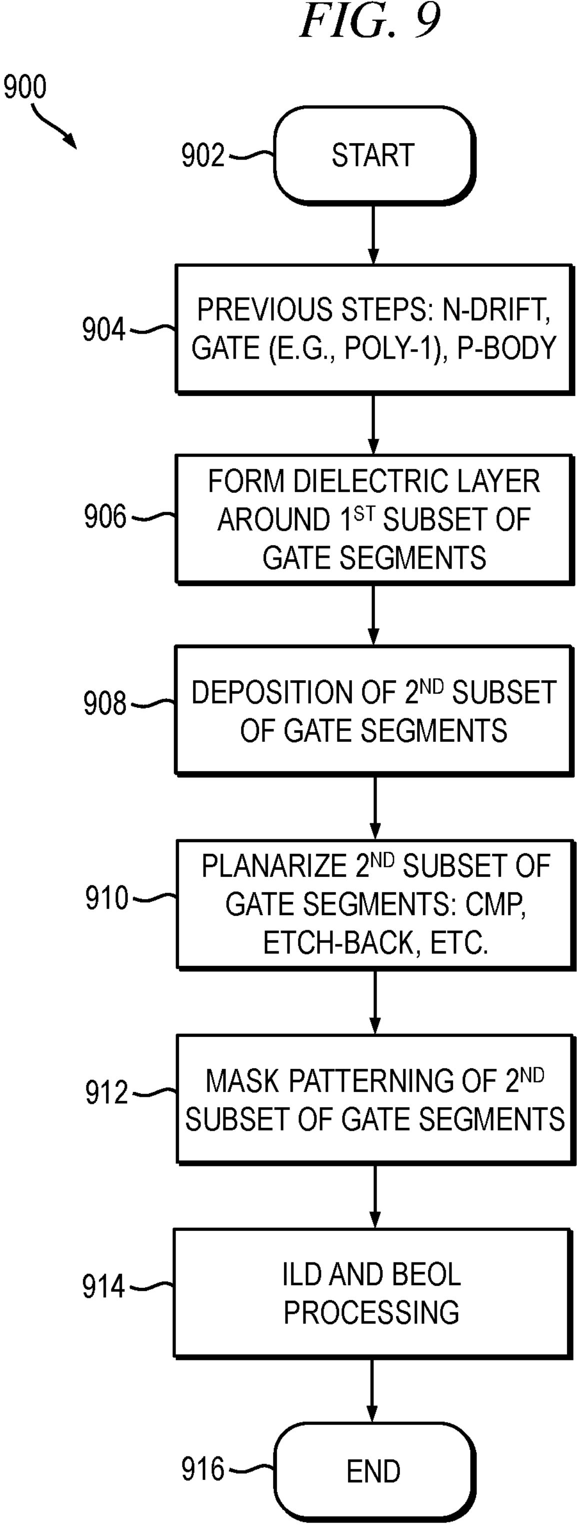
FIG. 9 is a process flow diagram depicting at least a portion of exemplary method steps performed in the fabrication of the illustrative LDMOS device shown in FIGS. 8A-8F, according to one or more embodiments of the present invention.

FIG. 9 is a process flow diagram depicting at least a portion of an exemplary method 900 for fabricating an LDMOS device having enhanced high-frequency performance, corresponding to the illustrative process steps shown in FIGS. 8A-8F, according to one or more embodiments of the invention. The method 900 begins at step 902, which is considered an initialization or start-up procedure. Step 904 involves performing preliminary process steps, including formation of the drift region (804), body region (806), and a first gate material layer (e.g., polysilicon), which will ultimately form a first subset of gate segments (810, 812, 814) in a gate structure of the LDMOS device, an example of which is shown in FIG. 8A. The first gate material layer may be formed in step 904 using a standard deposition process, as previously stated.

In step 906, a dielectric layer (816) is formed around the first subset of gate segments, an example of which is shown in FIG. 8B. Deposition of a second gate material layer (818), which will ultimately form a second subset of gate segments in the gate structure of the LDMOS device, is performed on at least a portion of an upper surface of the dielectric layer (816) in step 908, an example of which is shown in FIG. 8C. The second gate material layer (818) may be formed in step 908 using a standard deposition process, in one or more embodiments. The second gate material layer is planarized (i.e., flattened) in step 910, such as by using a CMP or etch-back process, an example of which is shown in FIG. 8D. The dielectric layer (816) formed in step 906 may be used as a stop layer for planarization, although it is to be understood that a height of the second gate material layer may be different than a height of the first gate material layer, in one or more embodiments.

In step 912, mask patterning is performed is define the second subset of gate segments (821, 822), an example of which is shown in FIG. 8E. BEOL and interlayer dielectric (ILD) processing is then performed to complete the LDMOS device in step 914 (forming source and drain regions, metal connections, etc.), an example of which is shown in FIG. 8F. The LDMOS fabrication method 900 ends at step 916.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having LDMOS devices therein formed in accordance with one or more embodiments of the invention, such as, for example, RF power amplifiers, power management ICs, etc.

An integrated circuit in accordance with aspects of the present disclosure can be employed in essentially any high-frequency, high-power application and/or electronic system, such as, but not limited to, RF power amplifiers, power management ICs, etc. Suitable systems for implementing embodiments of the invention may include, but are not limited to, DC-DC converters. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Relational terms such as "upper," "lower," "top," "bottom," "above" and "below," as may be recited herein, are used to indicate relative positioning of elements or structures to each other as opposed to absolute position. Thus, a surface referred to herein as an "upper" surface of a structure may become a "lower" surface when the structure is oriented upside-down relative to its initial position, and vice versa.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A laterally-diffused metal-oxide semiconductor (LDMOS) device having enhanced high-frequency performance, comprising:

a semiconductor substrate of a first conductivity type;

a doped drift region of a second conductivity type formed on at least a portion of the substrate, the second conductivity type being opposite in polarity to the first conductivity type;

a body region of the first conductivity type formed in the doped drift region proximate an upper surface of the doped drift region;

source and drain regions of the second conductivity type formed proximate an upper surface of the body region and doped drift region, respectively, and spaced apart laterally from one another;

a first insulating layer formed on at least a portion of an upper surface of the body region and an upper surface of the doped drift region; and a gate structure comprising a plurality of gate segments formed on an upper surface of the first insulating layer, each of the gate segments being spaced laterally from one another by a second insulating layer disposed between adjacent gate segments, wherein a spacing between adjacent ones of the gate segments is between about 2 nanometers (nm) to about 50 nm and is controlled as a function of a thickness of the second insulating layer, and wherein thicknesses of the first and second insulating layers are independently controlled.

2. The LDMOS device according to claim 1, wherein a first one of the gate segments is disposed over at least a portion of the body region, and remaining ones of the gate segments being disposed over the doped drift region, the first one of the gate segments forming a control gate of the LDMOS device configured to control formation of a channel and/or modulation of channel width in the body region beneath the first one of the gate segments for thereby controlling current flow between the drain region and source region in the LDMOS device.

3. The LDMOS device according to claim 1, further comprising dielectric spacers formed on sidewalls of outer gate segments of the gate structure for electrically isolating the gate structure from adjacent structures fabricated on the same substrate.

4. The LDMOS device according to claim 1, wherein a first one of the gate segments comprises a first conductive material, and wherein a second one of the gate segments comprises a second conductive material different from the first conductive material.

5. The LDMOS device according to claim 1, wherein the gate structure comprises a first subset of gate segments comprising a first material and a second subset of gate segments comprising a second material, the first and second materials being the same.

6. The LDMOS device according to claim 1, wherein respective upper surfaces of a first one of the gate segments, a second one of the gate segments, and a third one of the gate segments are coplanar, and wherein the first one of the gate segments is disposed over at least a portion of the body region.

7. The LDMOS device according to claim 1, wherein the gate structure comprises a first subset of gate segments having a first cross-sectional height, and a second subset of gate segments having a second cross-sectional height, the first and second cross-sectional heights being the same.

8. The LDMOS device according to claim 1, wherein a first one of the gate segments is between a second one of the gate segments and a third one of the gate segments, and wherein a first cross-sectional height of the first one of the gate segments is different from each of a second cross-sectional height of the second one of the gate segments and a third cross-sectional height of the third one of the gate segments.

9. The LDMOS device according to claim 1, wherein the first insulating layer comprises a different material from the second insulating layer.

10. The LDMOS device according to claim 1, wherein at least two of the gate segments are configured to receive the same bias voltage during on-state operation of the LDMOS device.

11. The LDMOS device according to claim 1, wherein a first one of the gate segments is electrically connected to the drain region.

12. The LDMOS device according to claim 1, wherein a first one of the gate segments is electrically connected to a second one of the gate segments.

13. The LDMOS device according to claim 1, wherein a first one of the gate segments is between a second one of the gate segments and a third one of the gate segments, and wherein an upper surface of the first one of the gate segments is non-coplanar with each of an upper surface of the second one of the gate segments and an upper surface of the third one of the gate segments.

14. The LDMOS device according to claim 1, wherein, between the adjacent ones of the gate segments, the second insulating layer has a lateral thickness between about 2 nm to about 50 nm.

15. The LDMOS device according to claim 8, wherein the first cross-sectional height is less than at least one of the second cross-sectional height or the third cross-sectional height.

16. A method for fabricating a laterally-diffused metal-oxide semiconductor (LDMOS) device having enhanced high-frequency performance, the method comprising:

forming a semiconductor substrate of a first conductivity type;

forming a doped drift region of a second conductivity type on at least a portion of the substrate, the second conductivity type being opposite in polarity to the first conductivity type;

forming a body region of the first conductivity type in the doped drift region proximate an upper surface of the doped drift region;

forming source and drain regions of the second conductivity type proximate an upper surface of the body region and doped drift region, respectively, and spaced apart laterally from one another;

forming a first insulating layer on at least a portion of an upper surface of the body region and an upper surface of the doped drift region; and forming a gate structure comprising a plurality of gate segments on an upper surface of the first insulating layer, each of the gate segments being spaced laterally from one another by a second insulating layer disposed between adjacent gate segments, wherein a spacing between adjacent ones of the gate segments is between about 2 nanometers (nm) to about 50 nm and is controlled as a function of a thickness of the second insulating layer, and wherein thicknesses of the first and second insulating layers are independently controlled.

17. A laterally-diffused metal-oxide semiconductor (LDMOS) device having enhanced high-frequency performance, comprising:

a semiconductor substrate of a first conductivity type;

a doped drift region of a second conductivity type formed on at least a portion of the substrate, the second conductivity type being opposite in polarity to the first conductivity type;

a body region of the first conductivity type formed in the doped drift region proximate an upper surface of the doped drift region;

source and drain regions of the second conductivity type formed proximate an upper surface of the body region and doped drift region, respectively, and spaced apart laterally from one another;

a first insulating layer formed on at least a portion of an upper surface of the body region and an upper surface of the doped drift region; and a gate structure comprising a plurality of gate segments formed on an upper surface of the first insulating layer, each of the gate segments being spaced laterally from one another by a second insulating layer disposed between adjacent gate segments, wherein upper surfaces of a first one of the gate segments, a second one of the gate segments, and a third one of the gate segments are coplanar, wherein the first one of the gate segments vertically overlaps at least a portion of the body region, wherein a portion of the second insulating layer that is between the first one of the gate segments and the second one of the gate segments is directly on the upper surface of the first insulating layer, and wherein the portion of the second insulating layer comprises at least one of: (i) a thickness that is different from a thickness of the first insulating layer, or (ii) a material that is different from a material of the first insulating layer.

18. The LDMOS device according to claim 17, wherein the first insulating layer comprises a different material from the portion of the second insulating layer, and wherein the portion of the second insulating layer comprises a nitride material.

19. The LDMOS device according to claim 17, wherein a continuous portion of the first insulating layer extends beneath the first one of the gate segments, the second one of the gate segments, and the third one of the gate segments, and wherein the continuous portion of the first insulating layer has a uniform thickness.

20. The LDMOS device according to claim 17, wherein the portion of the second insulating layer is a first portion, wherein the first portion of the second insulating layer extends along a sidewall of the second one of the gate segments, wherein a second portion of the second insulating layer extends between a lower surface of the second one of the gate segments and the upper surface of the first insulating layer, and wherein the second portion of the second insulating layer is in contact with the first portion of the second insulating layer.

21. The LDMOS device according to claim 17, wherein a thickness of the second one of the gate segments is different from a thickness of at least one of the first one of the gate segments or the third one of the gate segments.

* * * * *